(12) United States Patent
Tsai et al.

(10) Patent No.: US 10,027,304 B2
(45) Date of Patent: Jul. 17, 2018

(54) DUAL-BAND BAND-PASS FILTERS AND METHOD OF USE

(71) Applicant: TAIWAN SEMICONDUCTOR MANUFACTURING COMPANY, LTD., Hsinchu (TW)

(72) Inventors: Ming Hsien Tsai, New Taipei (TW); Fu-Lung Hsueh, Kaohsiung (TW); Sa-Lly Liu, Hsinchu (TW); Tzong-Lin Wu, Taipei (TW); Yang-Chih Huang, Kaohsiung (TW); Chin-Yi Lin, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 107 days.

(21) Appl. No.: 15/155,547

(22) Filed: May 16, 2016

(65) Prior Publication Data

US 2017/0331443 A1    Nov. 16, 2017

(51) Int. Cl.
*H03H 7/01* (2006.01)

(52) U.S. Cl.
CPC ........ *H03H 7/0115* (2013.01); *H03H 7/0161* (2013.01); *H03H 7/175* (2013.01); *H03H 7/1758* (2013.01); *H03H 7/1775* (2013.01)

(58) Field of Classification Search
CPC .... H03H 7/0115; H03H 7/175; H03H 7/1758; H03H 7/1766; H03H 7/1775; H03H 7/1783; H03H 7/1791; H03H 7/075; H93H 7/075

USPC ......................................... 333/175, 176, 185
See application file for complete search history.

(56) References Cited

U.S. PATENT DOCUMENTS

| | | | |
|---|---|---|---|
| 8,279,008 B2 | 10/2012 | Hsieh et al. | |
| 8,427,240 B2 | 4/2013 | Hsieh et al. | |
| 8,593,206 B2 | 11/2013 | Chen et al. | |
| 8,610,494 B1 | 12/2013 | Jin et al. | |
| 8,618,631 B2 | 12/2013 | Jin et al. | |
| 8,912,581 B2 | 12/2014 | Lin et al. | |

(Continued)

OTHER PUBLICATIONS

Wu, Stephen, et al., "A 900-MHz/1.8-GHz CMOS Receiver for Dual-Band Applications", IEEE Journal of Solid-State Circuits, pp. 2178-2185, vol. 33, No. 12, Dec. 1998.

(Continued)

*Primary Examiner* — Rakesh Patel
(74) *Attorney, Agent, or Firm* — Hauptman Ham, LLP

(57) ABSTRACT

A filter includes shunt circuits coupled between a reference node and each of an input port, an output port, a first node, and a second node. Resonant networks are coupled between the input port and the second node, and between the first node and the output port. Storage element circuits are coupled between the input port and the first node, and between the second node and the output port. The shunt circuits have an equivalent shunt circuit frequency response that partly defines a high passband frequency of the filter, the resonant networks have an equivalent resonant network frequency response that partly defines a low passband frequency of the filter, and the storage element circuits have an equivalent storage element circuit frequency response that defines a stopband frequency of the filter between the low passband frequency and the high passband frequency.

20 Claims, 5 Drawing Sheets

(56) References Cited

U.S. PATENT DOCUMENTS

| | | |
|---|---|---|
| 8,941,212 B2 | 1/2015 | Yen et al. |
| 9,184,256 B2 | 11/2015 | Huang et al. |
| 9,209,521 B2 | 12/2015 | Hung et al. |
| 2008/0204166 A1* | 8/2008 | Shafer .................. H03H 7/0115 333/176 |
| 2014/0132333 A1 | 5/2014 | Jin et al. |
| 2014/0253262 A1 | 9/2014 | Hsieh et al. |
| 2014/0253391 A1 | 9/2014 | Yen |
| 2015/0364417 A1 | 12/2015 | Lee |

OTHER PUBLICATIONS

Tsai, Lin-Chuan, et al., "Dual-Band Bandpass Filters Using Equal-Length Coupled-Serial-Shunted Lines and Z-Transform Technique", IEEE Transactions on Microwave Theory and Techniques, pp. 1111-1117, vol. 52, No. 4, Apr. 2004.

* cited by examiner

DUAL-BAND BAND-PASS FILTERS AND METHOD OF USE

BACKGROUND

Multiband communication systems are increasingly common in a number of applications including wireless local area networks (WLAN) such as WI-FI®, global system for mobile (GSM) communications, and vehicle radar. Dual-band band-pass filters are components of a number of these systems, and their value increases as size and cost are reduced.

Dual-band band-pass filters are sometimes implemented by cascading two individual filters, each with a single passband. Compared to individual filters, cascaded filters can be larger and have higher insertion losses.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
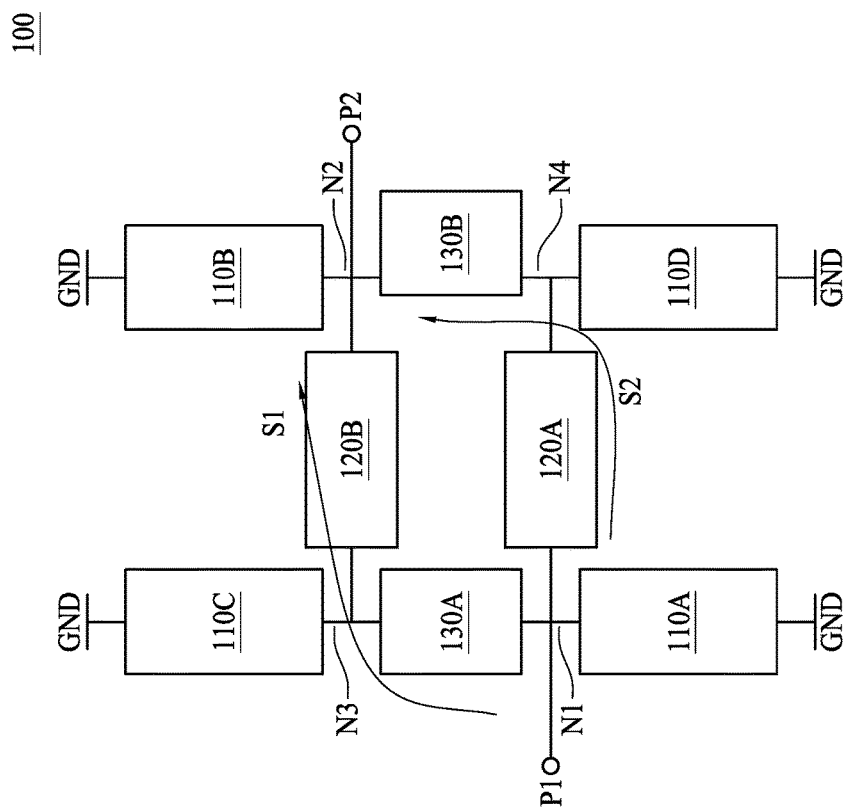
FIG. 1 is a diagram of a band-pass filter, in accordance with some embodiments.

The following disclosure provides different embodiments, or examples, for implementing features of the provided subject matter. Specific examples of components and arrangements are described below to simplify the present disclosure. These are, of course, merely examples and are not limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In various embodiments, a band-pass filter includes a first shunt circuit coupled between an input port and a reference node, a second shunt circuit coupled between an output port and the reference node, a third shunt circuit coupled between a first node and the reference node, and a fourth shunt circuit coupled between a second node and the reference node. A first resonant network is coupled between the input port and the second node, and a second resonant network is coupled between the first node and the output port. A first storage element circuit is coupled between the input port and the first node, and a second storage element circuit is coupled between the second node and the output port. The first through fourth shunt circuits have an equivalent frequency response that partly defines a high passband frequency of the filter. The first and second resonant networks have an equivalent frequency response that partly defines a low passband frequency of the filter. The first and second storage element circuits have an equivalent frequency response that defines a first stopband frequency of the filter between the low passband frequency and the high passband frequency. In some embodiments, the frequency response of the first through fourth shunt circuits defines a second stopband frequency of the filter.

FIG. 1 is a diagram of a band-pass filter 100, in accordance with some embodiments. Band-pass filter 100 includes an input port P1, an output port P2, a first node N1 coupled with input port P1, a second node N2 coupled with output port P2, a third node N3, a fourth node N4, and a reference node GND. A first shunt circuit 110A is coupled between nodes N1 and GND, a second shunt circuit 110B is coupled between nodes N2 and GND, a third shunt circuit 110C is coupled between nodes N3 and GND, and a fourth shunt circuit 110D is coupled between nodes N4 and GND. A first resonant network 120A is coupled between nodes N1 and N4, and a second resonant network 120B is coupled between nodes N2 and N3. A first storage element circuit 130A is coupled between nodes N1 and N3, and a second storage element circuit 130B is coupled between nodes N2 and N3.

Band-pass filter 100 is configured to receive an input signal at input port P1 and generate an output signal at output port P2. The input signal and output signal have time-varying voltage values relative to a reference voltage at reference node GND. In some embodiments, reference node GND is a ground reference node and the reference voltage is a ground reference voltage.

A first signal path S1 between input port P1 and output port P2 includes the series combination of storage element circuit 130A, node N3, and resonant network 120B. A second signal path S2 between input port P1 and output port P2 and parallel to first signal path S1 includes the series combination of resonant network 120A, node N4, and storage element circuit 130B. In operation, generating the output signal with band-pass filter 100 includes passing a first portion of the input signal through first signal path S1 and second signal path S2, and attenuating a second portion of the input signal with first signal path S1 and second signal path S2.

As discussed below, shunt circuits 110A-110D, resonant networks 120A and 120B, and storage element circuits 130A and 130B are configured to define a low frequency passband and a high frequency passband of the first, passed signal portion, and an intermediate frequency stopband of the second, attenuated signal portion.

A passband is a region of a frequency response of band-pass filter 100 in which an insertion loss of an input signal is at or near zero surrounded by regions of the frequency response in which the insertion loss has a significant non-zero magnitude. A return loss of an input signal has a significant non-zero magnitude in a passband region of the frequency response of band-pass filter 100, and is at or near zero in the surrounding regions. In some embodiments, a significant non-zero magnitude is 5 decibels (dB). In some embodiments, a significant non-zero magnitude is 10 dB. In some embodiments, a significant non-zero magnitude is 20 dB.

A transmission zero is a point in the frequency response of band-pass filter 100 at which a signal insertion loss curve has a local minimum. A local minimum of the signal insertion loss curve corresponds to a local maximum of the magnitude of the insertion loss. A return zero is a point in the frequency response of band-pass filter 100 at which a signal return loss curve has a local minimum. A local minimum of the signal return loss curve corresponds to a local maximum of the magnitude of the return loss.

In some embodiments, a passband of band-pass filter 100 has a single return zero. In some embodiments, a passband of band-pass filter 100 has two or more return zeros. A passband of band-pass filter 100 is therefore defined as a region having one or more return zeroes surrounded by regions having one or more transmission zeroes.

Band-pass filter 100 has a low passband separated from a high passband by a stopband. The stopband of band-pass filter 100 is defined as a region having one or more transmission zeroes surrounded by regions having one or more return zeroes.

A frequency of a passband of band-pass filter 100 is a frequency of any one of a transmission zero or return zero that defines the passband. A frequency of a stopband of band-pass filter 100 is a frequency of any one of a transmission zero or return zero that defines the stopband.

In some embodiments, band-pass filter 100 includes a low passband having a return zero at 900 Megahertz (MHz) and a high passband having a return zero at 1800 MHz. In some embodiments, band-pass filter 100 includes low passband having a return zero at 2.4 Gigahertz (GHz) and a high passband having a return zero at 5 GHz. In some embodiments, band-pass filter 100 includes a low passband having a return zero at 24 GHz and a high passband having a return zero at 77 GHz. A non-limiting example of a frequency response of band-pass filter 100 is discussed below with respect to FIG. 3.

Each of shunt circuits 110A-110D has an equivalent shunt circuit frequency response. Equivalent frequency responses are frequency responses having characteristics over a given frequency range that do not differ significantly. For example, two circuits having equivalent frequency responses have substantially the same, or equivalent, insertion losses at a given frequency. Similarly, two circuits having equivalent frequency responses have substantially the same, or equivalent, frequencies at which a given local minimum or maximum value such as an insertion loss occurs.

In some embodiments, each of shunt circuits 110A-110D has the equivalent shunt circuit frequency response based on having a same shunt circuit design, with any frequency response variations resulting from manufacturing process variations. In some embodiments, shunt circuits 110A-110D have the equivalent shunt circuit frequency response based on two or more different shunt circuit designs. A shunt circuit design includes at least one energy storage element. In some embodiments, a shunt circuit design includes a capacitor. In some embodiments, a shunt circuit design includes a capacitor in series with an inductor. In some embodiments, a shunt circuit design is a resonant network design.

In some embodiments, the shunt circuit frequency response causes a frequency response of band-pass filter 100 to include a first transmission zero at a first stopband frequency between a low passband and a high passband.

In some embodiments, at least one low passband frequency of band-pass filter 100 is defined in part by the shunt circuit frequency response of shunt circuits 110A-110D. In various embodiments, a low passband frequency defined in part by the shunt circuit frequency response of shunt circuits 110A-110D is a transmission zero frequency or a return zero frequency.

In some embodiments, at least one high passband frequency of band-pass filter 100 is defined in part by the shunt circuit frequency response of shunt circuits 110A-110D. In various embodiments, a high passband frequency defined in part by the shunt circuit frequency response of shunt circuits 110A-110D is a transmission zero frequency or a return zero frequency.

Each of resonant networks 120A and 120B has an equivalent resonant network frequency response. In some embodiments, resonant networks 120A and 20B have the equivalent resonant network frequency response based on having a same resonant network design, with any frequency response variations resulting from manufacturing process variations. In some embodiments, resonant networks 120A and 120B have the equivalent resonant network frequency response based on having different resonant network designs. A resonant network design includes at least two energy storage elements. In some embodiments, a resonant network design includes a capacitor and an inductor. In some embodiments, a resonant network design includes a capacitor in series with an inductor.

In some embodiments, at least one low passband frequency of band-pass filter 100 is defined in part by the resonant network frequency response of resonant networks 120A and 120B. In various embodiments, a low passband frequency defined in part by the shunt circuit frequency response of resonant networks 120A and 120B is a transmission zero frequency or a return zero frequency.

In some embodiments, at least one high passband frequency of band-pass filter 100 is defined in part by the resonant network frequency response of resonant network 120A and resonant network 120B. In various embodiments, a high passband frequency defined in part by the shunt circuit frequency response of resonant networks 120A and 120B is a transmission zero frequency or a return zero frequency.

Each of storage element circuits 130A and 130B has an equivalent storage element circuit frequency response. In some embodiments, storage element circuits 130A and 130B have the equivalent storage element circuit frequency response based on having a same storage element circuit design, with any frequency response variations resulting from manufacturing process variations. In some embodiments, storage element circuits 130A and 130B have the equivalent storage element circuit frequency response based on having different storage element circuit designs. A storage element circuit design includes at least one energy storage element. In some embodiments, a storage element circuit design includes an inductor. In some embodiments, a storage element circuit design includes a capacitor in series with an inductor. In some embodiments, a storage element circuit design is a resonant network design.

In some embodiments, the storage element circuit frequency response causes band-pass filter 100 to include a second transmission zero at a second stopband frequency between a low passband and a high passband.

In some embodiments, at least one low passband frequency of band-pass filter 100 is defined in part by the storage element circuit frequency response of storage element circuits 130A and 130B. In various embodiments, a low passband frequency defined in part by the storage element circuit frequency response of storage element circuits 130A and 130B is a transmission zero frequency or a return zero frequency.

In some embodiments, at least one high passband frequency of band-pass filter 100 is defined in part by the storage element circuit frequency response of storage element circuits 130A and 130B. In various embodiments, a high passband frequency defined in part by the storage element circuit frequency response of storage element circuits 130A and 130B is a transmission zero frequency or a return zero frequency.

In some embodiments, the combination of the shunt circuit frequency response of shunt circuits 110A-110D, the resonant circuit frequency response of resonant networks 120A and 120B, and the storage element circuit frequency response of storage element circuits 130A and 130B causes band-pass circuit 100 to include a third transmission zero below a low passband frequency.

In some embodiments, a third transmission zero of band-pass filter 100 and a first transmission zero of band-pass filter 100 set boundaries of a low passband of band-pass filter 100. In some embodiments, a third transmission zero of band-pass filter 100 and a second transmission zero of band-pass filter 100 set boundaries of a low passband of band-pass filter 100.

In some embodiments, the combination of the shunt circuit frequency response of shunt circuits 110A-110D, the resonant circuit frequency response of resonant networks 120A and 120B, and the storage element circuit frequency response of storage element circuits 130A and 130B causes band-pass circuit 100 to include a fourth transmission zero above a high passband frequency.

In some embodiments, a first transmission zero of band-pass filter 100 and a fourth transmission zero of band-pass filter 100 set boundaries of a high passband of band-pass filter 100. In some embodiments, a second transmission zero of band-pass filter 100 and a fourth transmission zero of band-pass filter 100 set boundaries of a high passband of band-pass filter 100.

In some embodiments, a first transmission zero of band-pass filter 100 and a second transmission zero of band-pass filter 100 set boundaries of a stopband of band-pass filter 100 between a low passband and a high passband. In some embodiments, a first transmission zero of band-pass filter 100 and a second transmission zero of band-pass filter 100 set boundaries of a stopband of band-pass filter 100 by having different frequencies between a low passband and a high passband. In some embodiments, a first transmission zero of band-pass filter 100 and a second transmission zero of band-pass filter 100 set boundaries of a stopband of band-pass filter 100 by having an equivalent frequency between a low passband and a high passband.

In various embodiments, combinations of some or all of first through fourth transmission zeroes of band-pass filter 100 define dual-pass band-pass filters, each having a low passband and a high passband separated by an intermediate stopband. Frequency responses of each of shunt circuits 110A-110D, resonant networks 120A and 120B, and storage element circuits 130A and 130B thereby define a low passband frequency and bandwidth, a high passband frequency and bandwidth, and at least one stopband frequency.

In some embodiments, by configuring each of shunt circuits 110A-110D and storage element circuits 130A and 130B to have a frequency response so that a first transmission zero of band-pass filter 100 and a second transmission zero of band-pass filter 100 have different frequencies, a low passband bandwidth and a high passband bandwidth are controlled independently.

In some embodiments, by configuring each of shunt circuits 110A-110D and storage element circuits 130A and 130B to have a frequency response so that a first transmission zero of band-pass filter 100 and a second transmission zero of band-pass filter 100 have an equivalent frequency, each of a low passband bandwidth and a high passband bandwidth is large in comparison to bandwidths of other approaches.

In some embodiments, by configuring each of shunt circuits 110A-110D and storage element circuits 130A and 130B to have a frequency response so that a first transmission zero of band-pass filter 100 and a second transmission zero of band-pass filter 100 have an equivalent frequency at or near a center of a stopband, the stopband is symmetrical in comparison to stopbands of other approaches.

Figure 2:
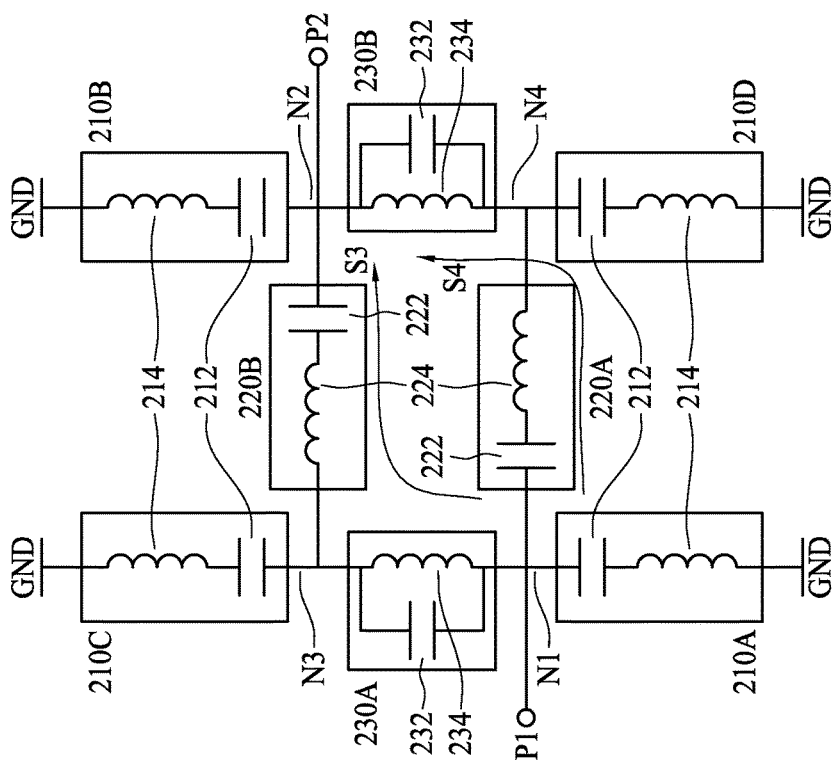
FIG. 2 is a diagram of a band-pass filter, in accordance with some embodiments.

FIG. 2 is a diagram of a band-pass filter 200, in accordance with some embodiments. In some embodiments, band-pass filter 200 is usable as band-pass filter 100, described above with respect to FIG. 1. Band-pass filter 200 includes input port P1, output port P2, nodes N1, N2, N3, and N4, and reference node GND, discussed above with respect to band-pass filter 100.

As non-limiting examples of shunt circuits 110A-110D, discussed above with respect to band-pass filter 100, band-pass circuit 200 includes a first resonant network 210A coupled between nodes N1 and GND, a second resonant network 210B coupled between nodes N2 and GND, a third resonant network 210C coupled between nodes N3 and GND, and a fourth resonant network 210D coupled between nodes N4 and GND. Each of resonant networks 210A-210D includes a capacitor 212 in series with an inductor 214.

As non-limiting examples of resonant networks 120A and 120B, discussed above with respect to band-pass filter 100, band-pass circuit 200 includes a first resonant network 220A coupled between nodes N1 and N4, and a second resonant network 220B coupled between nodes N2 and N3. Each of resonant networks 220A and 220B includes a capacitor 222 in series with an inductor 224.

As non-limiting examples of storage element circuits 130A and 130B, discussed above with respect to band-pass filter 100, band-pass circuit 200 includes a first resonant network 230A coupled between nodes N1 and N3, and a second resonant network 230B coupled between nodes N2 and N3. Each of resonant networks 230A and 230B includes a capacitor 232 in parallel with an inductor 234.

A first signal path S3 between input port P1 and output port P2 includes the series combination of resonant network 230A, node N3, and resonant network 220B. A second signal path S4 between input port P1 and output port P2 parallel to first signal path S3 includes the series combination of resonant network 220A, node N4, and resonant network 230B.

Each of resonant networks 210A-210D has an equivalent first resonant network frequency response based on having a same first resonant network design. The first resonant network frequency response causes band-pass circuit 200 to include a first transmission zero at a first stopband frequency. In operation, each of resonant networks 210A-210D is configured by the first resonant network design to establish a low-impedance path between a corresponding node and reference node GND at the first stopband frequency. Specifically, in operation, at the first stopband frequency, resonant network 210A establishes a low-impedance path from input port P1 and node N1 to reference node GND, resonant network 210B establishes a low-impedance path from output port P2 and node N2 to reference node GND, resonant network 210C establishes a low-impedance path from node N3 to reference node GND, and resonant network 210D establishes a low-impedance path from node N4 to reference node GND.

The first stopband frequency is based on capacitor 212 and inductor 214 and defined by the equation $$f1 = 1/(2\pi\sqrt{L214 \times C212}) \quad (1)$$

where L214 is the inductance value of inductor 214 and C212 is the capacitance value of capacitor 212.

In some embodiments, capacitor 212 has a capacitance value of 0.33 picoFarads (pF), inductor 214 has an inductance value of 37 picoHenries (pH), and the first stopband frequency is 46 GHz.

At least one low passband frequency and at least one high passband frequency of band-pass filter 200 are defined in part by the first resonant network frequency response of resonant networks 210A-210D.

Each of resonant networks 220A and 220B has an equivalent second resonant network frequency response based on having a same second resonant network design. At least one low passband frequency and at least one high passband frequency of band-pass filter 200 are defined in part by the second resonant network frequency response of resonant networks 220A and 220B.

Each of resonant networks 230A and 230B has an equivalent third resonant network frequency response based on having a same third resonant network design. The third resonant network frequency response causes band-pass circuit 200 to include a second transmission zero at a second stopband frequency. In operation, at the second stopband frequency, resonant network 230A is configured by the third resonant network design to establish a high-impedance path between nodes N1 and N3, and resonant network 230B is configured by the third resonant network design to establish a high-impedance path between nodes N2 and N4.

The second stopband frequency is based on capacitor 232 and inductor 234 and defined by the equation $$f2 = 1/(2\pi\sqrt{L234 \times C232}) \quad (2)$$

where L234 is the inductance value of inductor 234 and C232 is the capacitance value of capacitor 232.

In some embodiments, capacitor 232 has a capacitance value of 70 femtoFarads (fF), inductor 234 has an inductance value of 0.185 nanoHenries (nH), and the second stopband frequency is 44 GHz.

At least one low passband frequency and at least one high passband frequency of band-pass filter 200 are defined in part by the third resonant network frequency response of resonant networks 230A and 230B.

The combination of the first resonant network frequency response of resonant networks 210A-210D, the second resonant circuit frequency response of resonant networks 220A and 220B, and the third resonant circuit frequency response of resonant networks 230A and 230B causes band-pass circuit 200 to include a third transmission zero below a low passband frequency and a fourth transmission zero above a high passband frequency.

The third transmission zero sets a lower boundary of a low passband of band-pass filter 200 and one or both of the first and second transmission zeroes sets an upper boundary of the low passband of band-pass filter 200. One or both of the first and second transmission zeroes sets a lower boundary of a high passband of band-pass filter 200 and the fourth transmission zero sets an upper boundary of the high passband of band-pass filter 200. The first and second transmission zeroes thereby set a stopband of band-pass filter 200.

In some embodiments, the first and second transmission zeroes of band-pass filter 200 set stopband boundaries by having different frequencies between the low passband and the high passband. In some embodiments, the first and second transmission zeroes of band-pass filter 200 set stopband boundaries by having an equivalent frequency between the low passband and the high passband.

At frequencies below the stopband boundaries, the first resonant network frequency response is dominated by capacitor 212, the second resonant network frequency response is dominated by capacitor 222, and the third resonant network frequency response is dominated by inductor 234, so the third transmission zero has a frequency substantially defined by the equation $$f3 = 1/(2\pi\sqrt{L234 \times (C212 + C222)}) \quad (3)$$

where L234 is the inductance value of inductor 234 and C212 is the capacitance value of capacitor 212, and C222 is the capacitance value of capacitor 222.

In some embodiments, capacitor 212 has a capacitance value of 0.33 pF, capacitor C222 has a capacitance value of 0.07 pF, inductor 234 has an inductance value of 0.185 nH, and the third transmission zero has frequency of 18.5 GHz.

At frequencies above the stopband boundaries, the first resonant network frequency response is dominated by inductor 214, the second resonant network frequency response is dominated by inductor 224, and the third resonant network frequency response is dominated by capacitor 232, so the fourth transmission zero has a frequency substantially defined by the equation $$f4 = 1/(2\pi\sqrt{C232 \times (L214 \| L224)}) \quad (4)$$

where C232 is the capacitance value of capacitor 232, L214 is the inductance value of inductor 214, and L224 is the inductance value of inductor 224.

In some embodiments, capacitor 232 has a capacitance value of 70 fF, inductor 214 has an inductance value of 37 pH, inductor L224 has an inductance value of 190 pH, and the fourth transmission zero has a frequency of 108 GHz.

Figure 3:
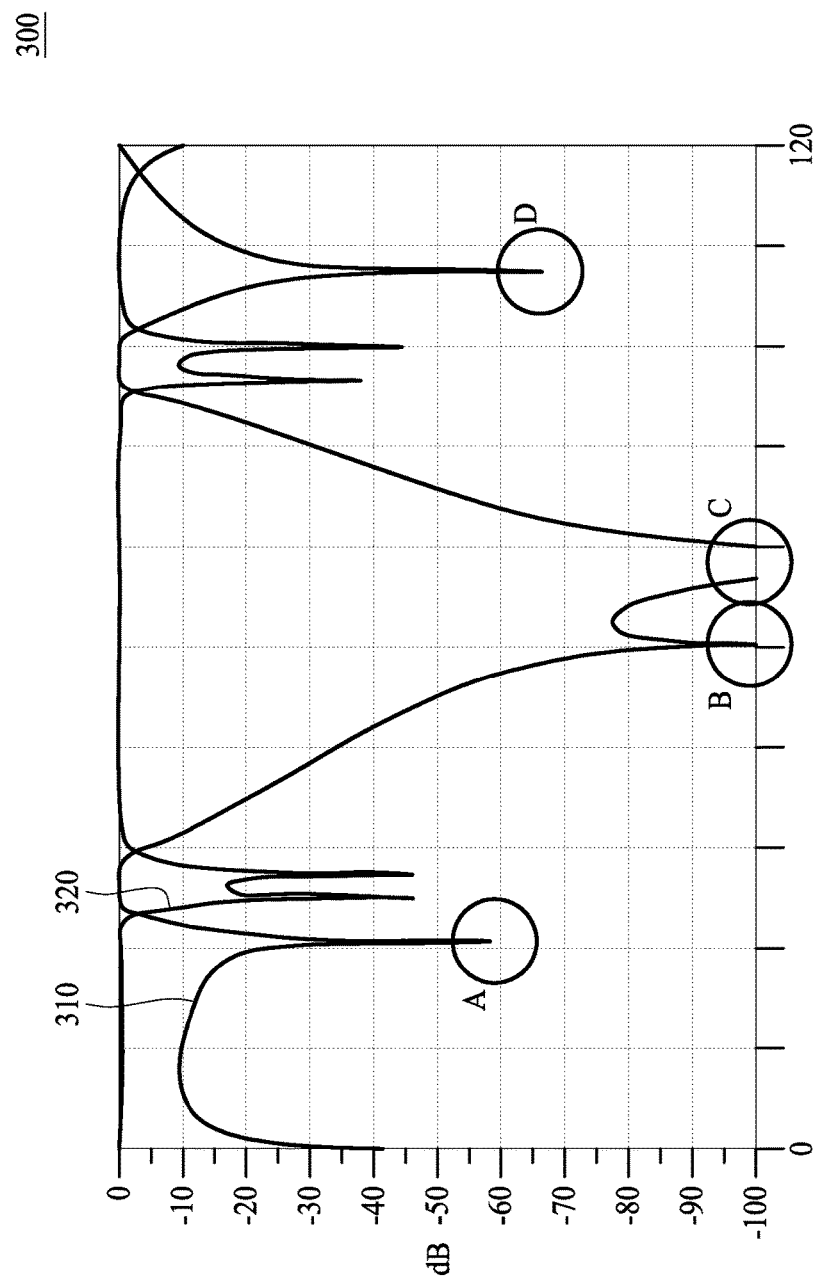
FIG. 3 is a diagram of a frequency response of a band-pass filter, in accordance with some embodiments.

FIG. 3 is a diagram of a frequency response 300 of a band-pass filter, in accordance with some embodiments. Frequency response 300 is a non-limiting example of a frequency response of a band-pass filter 100 or a band-pass filter 200, discussed above. Frequency response 300 is based on a capacitance value C212 of 330 fF, an inductance value L214 of 37 pH, a capacitance value C222 of 70 fF, an inductance value C224 of 190 pH, a capacitance value C232 of 70 fF, an inductance value C234 of 185 pH.

Frequency response 300 includes an insertion loss curve 310 and an input return loss curve 320. Each of insertion loss curve 310 and input return loss curve 320 is plotted over a frequency range of 0 GHz to 120 GHz and a power loss range of 0 dB to −100 dB.

Insertion loss curve 310 includes a first transmission zero A, a second transmission zero B, a third transmission zero C, and a fourth transmission zero D. First transmission zero A has a frequency of 18.5 GHz based on equation (3), second transmission zero B has a frequency of 44 GHz based on equation (2), third transmission zero C has a frequency of 46 GHz based on equation (1), and fourth transmission zero D has a frequency of 108 GHz based on equation (4).

Transmission zeroes B and C of frequency response 300 have different frequencies. In some embodiments, transmission zeroes B and C have an equivalent frequency.

Figure 4:
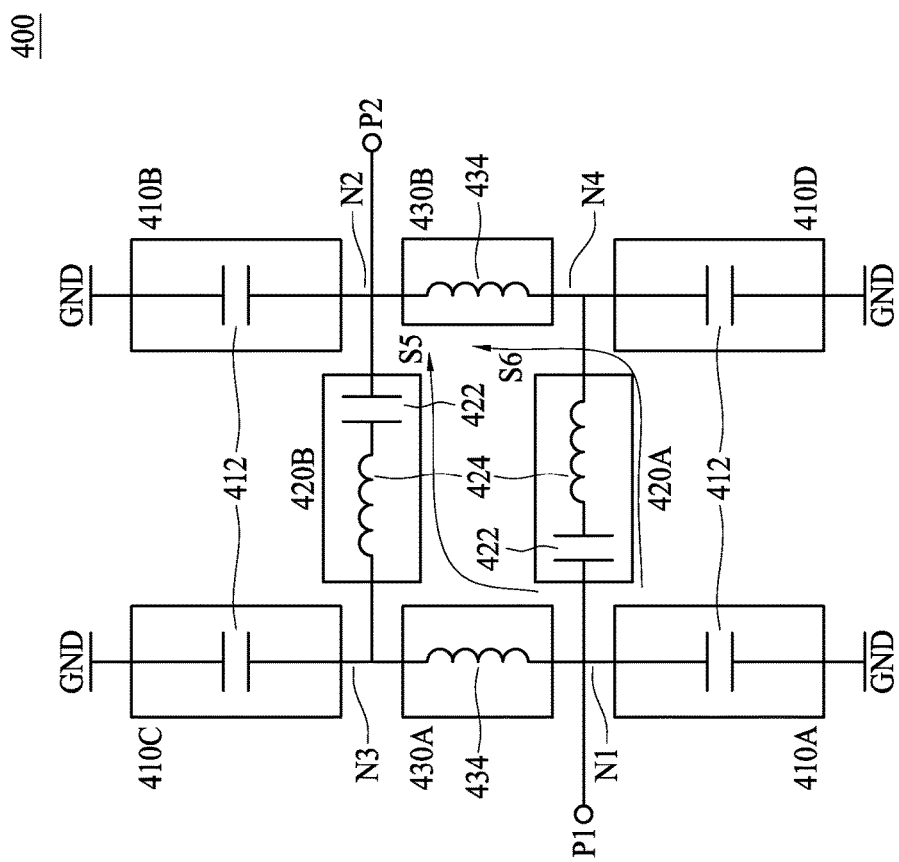
FIG. 4 is a diagram of a band-pass filter, in accordance with some embodiments.

FIG. 4 is a diagram of a band-pass filter 400, in accordance with some embodiments. In some embodiments, band-pass filter 400 is usable as band-pass filter 100, described above with respect to FIG. 1. Band-pass filter 400 includes input port P1, output port P2, nodes N1, N2, N3, and N4, and reference node GND, discussed above with respect to band-pass filter 100.

As non-limiting examples of shunt circuits 110A-110D, discussed above with respect to band-pass filter 100, band-pass circuit 400 includes a first shunt circuit 410A coupled between nodes N1 and GND, a second shunt circuit 410B coupled between nodes N2 and GND, a third shunt circuit 410C coupled between nodes N3 and GND, and a fourth shunt circuit 410D coupled between nodes N4 and GND. Each of shunt circuits 410A-410D includes a capacitor 412.

As non-limiting examples of resonant networks 120A and 120B, discussed above with respect to band-pass filter 100, band-pass circuit 400 includes a first resonant network 420A coupled between nodes N1 and N4, and a second resonant network 420B coupled between nodes N2 and N3. Each of resonant networks 420A and 420B includes a capacitor 422 in series with an inductor 424.

As non-limiting examples of storage element circuits 130A and 130B, discussed above with respect to band-pass filter 100, band-pass circuit 400 includes a first storage element circuit 430A coupled between nodes N1 and N3, and a second storage element circuit 430B coupled between nodes N2 and N3. Each of storage element circuits 430A and 430B includes an inductor 434.

A first signal path S5 between input port P1 and output port P2 includes the series combination of storage element circuit 430A, node N3, and resonant network 420B. A second signal path S6 between input port P1 and output port P2 and parallel to first signal path S5 includes the series combination of resonant network 420A, node N4, and storage element circuit 430B.

Compared to band-pass circuit 200, discussed above, band-pass circuit 400 has fewer components and therefore occupies less space. Because band-pass circuit 400 includes shunt circuits 410A-410D and storage element circuits 430A and 430B as opposed to resonant networks 210A-210D and 230A-230D, respectively, of band-pass circuit 200, band-pass circuit 400 is not configured to be capable of independent control of a low passband bandwidth and a high passband bandwidth, unlike band-pass circuit 200.

Figure 5:
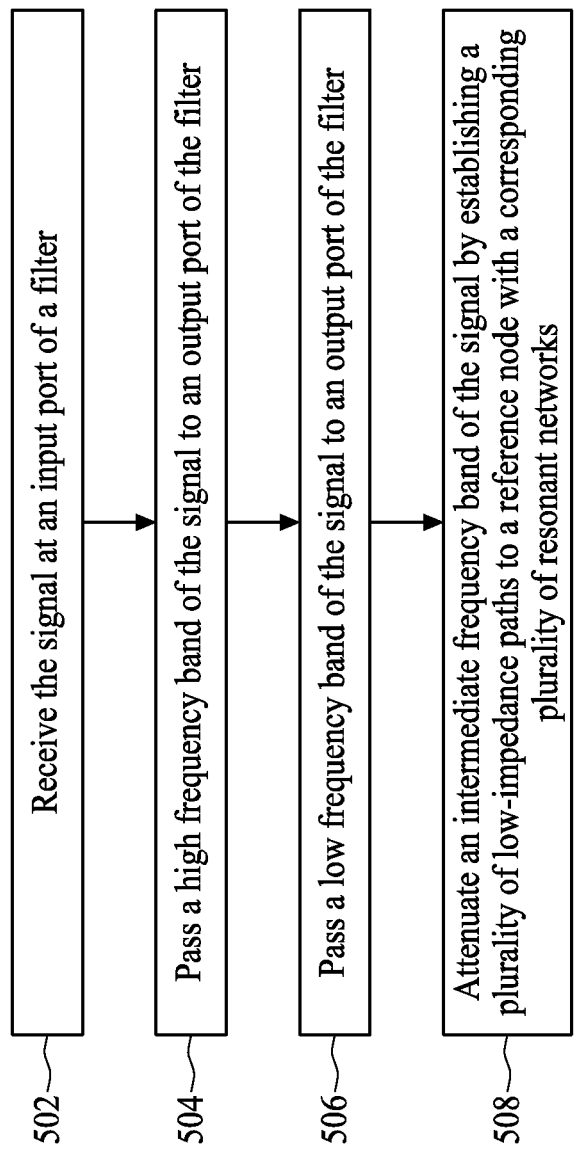
FIG. 5 is a flow chart of a method of filtering a signal, in accordance with some embodiments.

FIG. 5 is a flow chart of a method 500 of filtering a signal, in accordance with some embodiments. Method 500 is capable of being performed with a band-pass filter 100 or 200, described above with respect to FIGS. 1 and 2, respectively.

At operation 502, an input port of a filter receives a signal. In various embodiments, the input port of a filter receiving a signal is an input port P1 of a band-pass filter 100 or a band-pass filter 200.

At operation 504, the filter passes a high frequency band of the signal to an output port of the filter. The high frequency band has a first frequency partly defined by a first resonant network design. Passing the high frequency band of the signal includes passing the signal along two parallel paths, each path of the parallel paths including a resonant network of a second resonant network design in series with a resonant network of a third resonant network design.

In some embodiments, the two parallel paths are signal paths S1 and S2 of a band-pass filter 100. In some embodiments, the two parallel paths are signal paths S3 and S4 of a band-pass filter 200. In some embodiments, the output port is an output port P2 of a band-pass filter 100 or a band-pass filter 200.

In various embodiments, one or more of the resonant networks of the first, second, and third resonant network designs are one or more of shunt circuits 110A-110D, resonant networks 120A and 120B, and storage element circuits 130A and 130B, described above with respect to band-pass filter 100. In various embodiments, one or more of the resonant networks of the first, second, and third resonant network designs are one or more of resonant networks 210A-210D, 220A and 220B, and 230A and 230B, respectively, described above with respect to band-pass filter 200.

At operation 506, the filter passes a low frequency band of the signal to the output port of the filter. The low frequency band has a second frequency partly defined by the second resonant network design. Passing the low frequency band of the signal includes passing the signal along the two parallel paths.

At operation 508, the filter attenuates an intermediate frequency band of the signal, the intermediate frequency band having a third frequency defined by the third resonant network design. Attenuating the intermediate frequency band includes establishing a plurality of low-impedance paths to a reference node with a corresponding plurality of resonant networks of the first resonant network design.

In some embodiments, establishing the plurality of low-impedance paths is based on a first transmission zero of the filter.

In some embodiments, attenuating the intermediate frequency band further includes establishing a high-impedance path in each path of the parallel paths with the resonant network of the third resonant network design.

In some embodiments, establishing the high-impedance path in each path of the parallel paths is based on a second transmission zero of the filter. In some embodiments, the first transmission zero and the second transmission zero have different frequencies. In some embodiments, the first transmission zero and the second transmission zero have an equivalent frequency.

In some embodiments, establishing the plurality of low-impedance paths includes establishing a first low-impedance path of the plurality of low-impedance paths between the input port and the reference node, establishing a second low-impedance path of the plurality of low-impedance paths between the output port and the reference node, establishing a third low-impedance path of the plurality of low-impedance paths between a first node of the first path of the parallel paths and the reference node, and establishing a fourth low-impedance path of the plurality of low-impedance paths between a second node of the second path of the parallel paths and the reference node.

In some embodiments, a filter comprises a first shunt circuit coupled between an input port and a reference node, a second shunt circuit coupled between an output port and the reference node, a third shunt circuit coupled between a first node and the reference node, and a fourth shunt circuit coupled between a second node and the reference node. A first resonant network is coupled between the input port and the second node, a second resonant network is coupled between the first node and the output port, a first storage element circuit is coupled between the input port and the first node, and a second storage element circuit is coupled between the second node and the output port. The first shunt circuit, the second shunt circuit, the third shunt circuit, and the fourth shunt circuit are configured to have an equivalent shunt circuit frequency response that partly defines a high passband frequency of the filter, the first resonant network and the second resonant network are configured to have an equivalent resonant network frequency response that partly defines a low passband frequency of the filter, and the first storage element circuit and the second storage element circuit are configured to have an equivalent storage element circuit frequency response that defines a stopband frequency of the filter between the low passband frequency and the high passband frequency.

In some embodiments, a filter comprises a first resonant network having a first resonant network design coupled between an input port and a reference node, a second resonant network having the first resonant network design coupled between an output port and the reference node, a first signal path coupled between the input port and the output port, and a second signal path coupled between the input port and the output port. Each of the first signal path and the second signal path comprises a resonant network having a second resonant network design in series with a resonant network having a third resonant network design joined at a node, and an additional resonant network having the first resonant network design coupled between the node and the reference node. The first resonant network design partly defines a high passband frequency of the filter and defines a first stopband frequency of the filter below the high passband frequency, the second resonant network design partly defines a low passband frequency of the filter below the first stopband frequency, and the third resonant network design defines a second stopband frequency of the filter between the low passband frequency and the high passband frequency.

In some embodiments, a method of filtering a signal comprises receiving the signal at an input port of a filter, passing a high frequency band of the signal to an output port of the filter, the high frequency band having a first frequency partly defined by a first resonant network design, passing a low frequency band of the signal to the output port of the filter, the low frequency band having a second frequency partly defined by a second resonant network design, and attenuating an intermediate frequency band of the signal, the intermediate frequency band having a third frequency defined by a third resonant network design. Each of passing the high frequency band and passing the low frequency band comprises passing the signal along two parallel paths, each path of the parallel paths comprising a resonant network of the second resonant network design in series with a resonant network of the third resonant network design. Attenuating the intermediate frequency band comprises establishing a plurality of low-impedance paths to a reference node with a corresponding plurality of resonant networks of the first resonant network design.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A filter comprising:
   a first shunt circuit coupled between an input port and a reference node;
   a second shunt circuit coupled between an output port and the reference node;
   a third shunt circuit coupled between a first node and the reference node;
   a fourth shunt circuit coupled between a second node and the reference node;
   a first resonant network coupled between the input port and the second node;
   a second resonant network coupled between the first node and the output port;
   a first storage element circuit coupled between the input port and the first node; and
   a second storage element circuit coupled between the second node and the output port,
   wherein
      the first shunt circuit, the second shunt circuit, the third shunt circuit, and the fourth shunt circuit are configured to have an equivalent shunt circuit frequency response that partly defines a high passband frequency of the filter,
      the first resonant network and the second resonant network are configured to have an equivalent resonant network frequency response that partly defines a low passband frequency of the filter, and
      the first storage element circuit and the second storage element circuit are configured to have an equivalent storage element circuit frequency response that defines a stopband frequency of the filter between the low passband frequency and the high passband frequency.

2. The filter of claim 1, wherein each of the first shunt circuit, the second shunt circuit, the third shunt circuit, and the fourth shunt circuit comprises a capacitor.

3. The filter of claim 2, wherein each of the first shunt circuit, the second shunt circuit, the third shunt circuit, and the fourth shunt circuit further comprises the capacitor in series with an inductor.

4. The filter of claim 1, wherein each of the first resonant network and the second resonant network comprises a capacitor in series with an inductor.

5. The filter of claim 1, wherein each of the first storage element circuit and the second storage element circuit comprises an inductor.

6. The filter of claim 5, wherein each of the first storage element circuit and the second storage element circuit further comprises a capacitor in parallel with the inductor.

7. The filter of claim 1, wherein the first shunt circuit, the second shunt circuit, the third shunt circuit, and the fourth shunt circuit define a transmission zero of the filter in the stopband.

8. The filter of claim 1, wherein the first storage element circuit and the second storage element circuit define a transmission zero of the filter in the stopband.

9. The filter of claim 1, wherein:
   the first shunt circuit, the second shunt circuit, the third shunt circuit, and the fourth shunt circuit define a first transmission zero of the filter in the stopband;
   the first storage element circuit and the second storage element circuit define a second transmission zero of the filter in the stopband; and
   the first transmission zero and the second transmission zero have an equivalent frequency.

10. A filter comprising:
a first resonant network having a first resonant network design coupled between an input port and a reference node;
a second resonant network having the first resonant network design coupled between an output port and the reference node;
a first signal path coupled between the input port and the output port; and
a second signal path coupled between the input port and the output port and parallel to the first signal path,
wherein
each of the first signal path and the second signal path comprises:
a resonant network having a second resonant network design in series with a resonant network having a third resonant network design joined at a node; and
an additional resonant network having the first resonant network design coupled between the node and the reference node,
the first resonant network design partly defines a high passband frequency of the filter and defines a first stopband frequency of the filter below the high passband frequency,
the second resonant network design partly defines a low passband frequency of the filter below the first stopband frequency, and
the third resonant network design defines a second stopband frequency of the filter between the low passband frequency and the high passband frequency.

11. The filter of claim 10, wherein the first stopband frequency and the second stopband frequency are equivalent.

12. The filter of claim 10, wherein:
the first resonant network design comprises a first capacitor having a first capacitance value;
the second resonant network design comprises a second capacitor having a second capacitance value;
the third resonant network design comprises an inductor having an inductance value; and
the first capacitance value, the second capacitance value, and the inductance value define a transmission zero of the filter having a frequency below the low passband frequency.

13. The filter of claim 10, wherein:
the first resonant network design comprises a first inductor having a first inductance value;
the second resonant network design comprises a second inductor having a second inductance value;
the third resonant network design comprises a capacitor having a capacitance value; and
the first inductance value, the second inductance value, and the capacitance value define a transmission zero of the filter having a frequency above the high passband frequency.

14. The filter of claim 10, wherein:
the first resonant network design comprises a capacitor in series with an inductor; and
a capacitance value of the capacitor and an inductance value of the inductor define a transmission zero of the filter having the first stopband frequency.

15. The filter of claim 10, wherein:
the third resonant network design comprises a capacitor in parallel with an inductor; and
a capacitance value of the capacitor and an inductance value of the inductor define a transmission zero of the filter having the second stopband frequency.

16. The filter of claim 10, wherein the second resonant network design comprises a capacitor in series with an inductor.

17. A method of filtering a signal, the method comprising:
receiving the signal at an input port of a filter;
passing a high frequency band of the signal to an output port of the filter, the high frequency band having a first frequency partly defined by a first resonant network design;
passing a low frequency band of the signal to the output port of the filter, the low frequency band having a second frequency partly defined by a second resonant network design; and
attenuating an intermediate frequency band of the signal, the intermediate frequency band having a third frequency defined by a third resonant network design,
wherein
each of passing the high frequency band and passing the low frequency band comprises passing the signal along two parallel paths, each path of the parallel paths comprising a resonant network of the second resonant network design in series with a resonant network of the third resonant network design, and
attenuating the intermediate frequency band comprises establishing a plurality of low-impedance paths to a reference node with a corresponding plurality of resonant networks of the first resonant network design.

18. The method of claim 17, wherein attenuating the intermediate frequency band further comprises establishing a high-impedance path in each path of the parallel paths with the resonant network of the third resonant network design.

19. The method of claim 18, wherein
establishing the plurality of low-impedance paths is based on a first transmission zero of the filter,
establishing each high-impedance path is based on a second transmission zero of the filter, and
the first transmission zero and the second transmission zero have an equivalent frequency.

20. The method of claim 17, wherein establishing the plurality of low-impedance paths to the reference nodes comprises:
establishing a first low-impedance path of the plurality of low-impedance paths between the input port and the reference node;
establishing a second low-impedance path of the plurality of low-impedance paths between the output port and the reference node;
establishing a third low-impedance path of the plurality of low-impedance paths between a first node of the first path of the parallel paths and the reference node; and
establishing a fourth low-impedance path of the plurality of low-impedance paths between a second node of the second path of the parallel paths and the reference node.

* * * * *